US010522969B2

(12) United States Patent
Hashimoto et al.

(10) Patent No.: US 10,522,969 B2
(45) Date of Patent: Dec. 31, 2019

(54) LIGHT-EMITTING DEVICE AND LID BODY USED IN LIGHT-EMITTING DEVICE

(71) Applicants: NICHIA CORPORATION, Anan-shi, Tokushima (JP); SHINKO ELECTRIC INDUSTRIES CO., LTD., Nagano-shi, Nagano (JP)

(72) Inventors: Takuya Hashimoto, Tokushima (JP); Kazuma Kozuru, Tokushima (JP); Eiichiro Okahisa, Tokushima (JP); Katsuya Nakazawa, Nagano (JP); Makoto Kubota, Nagano (JP)

(73) Assignees: NICHIA CORPORATION, Anan-Shi (JP); SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 16/164,588

(22) Filed: Oct. 18, 2018

(65) Prior Publication Data

US 2019/0123509 A1    Apr. 25, 2019

(30) Foreign Application Priority Data

Oct. 20, 2017   (JP) .................................. 2017-203385

(51) Int. Cl.
*H01S 5/40* (2006.01)
*H01S 5/022* (2006.01)
*H01S 5/042* (2006.01)

(52) U.S. Cl.
CPC ...... *H01S 5/02216* (2013.01); *H01S 5/02236* (2013.01); *H01S 5/02296* (2013.01); *H01S 5/0425* (2013.01); *H01S 5/4025* (2013.01)

(58) Field of Classification Search
CPC ............ H01S 5/02216; H01S 5/02296; H01S 5/4025; H01S 5/4031; H01S 5/423
See application file for complete search history.

(56) References Cited

U.S. PATENT DOCUMENTS

| 9,746,160 B2 * | 8/2017 | Kozuru | ................. F21V 17/101 |
| 2016/0341395 A1 * | 11/2016 | Kiyota | ............... G02B 19/0057 |

FOREIGN PATENT DOCUMENTS

| JP | 2017-034242 A | 2/2017 |
| JP | 2017-138566 A | 8/2017 |
| JP | 2017-139444 A | 8/2017 |

* cited by examiner

*Primary Examiner* — Michael Carter
(74) *Attorney, Agent, or Firm* — Foley & Lardner LLP

(57) ABSTRACT

A light-emitting device includes: a package body; a lid body connected to the package body, wherein the package body and the lid body together form a sealed space; and a plurality of light-emitting elements disposed in the sealed space. The lid body includes: a non-transmissive member including an outer frame, and one or more inner frames connected to the outer frame, wherein the outer frame and the one or more inner frames define a plurality of openings, a transmissive member integrally covering the plurality of openings and configured to allow light emitted from the plurality of light-emitting elements to be transmitted through the plurality of openings, and an adhesive member fixing the transmissive member to the non-transmissive member. The adhesive member is located on the outer frame and is not located on the one or more inner frames.

18 Claims, 8 Drawing Sheets

LIGHT-EMITTING DEVICE AND LID BODY USED IN LIGHT-EMITTING DEVICE

CROSS-REFERENCE TO RELATED APPLICATIONS

This application claims priority to Japanese Patent Application No. 2017-203385, filed on Oct. 20, 2017, the disclosure of which is hereby incorporated by reference in its entirety.

BACKGROUND

The present disclosure relates to a light-emitting device and a lid body used in the light-emitting device.

Known light-emitting devices include a package body, a lid body, and a plurality of light-emitting elements disposed in sealed space surrounded by the package body and the lid body (see Japanese Patent Publication Nos. 2017-139444, 2017-138566, and 2017-034242).

Japanese Patent Publication No. 2017-139444 describes a light source device having a support frame provided with one opening corresponding to all light-emitting elements and one transmissive member covering the opening. Japanese Patent Publication No. 2017-138566 describes a light source device having a support member provided with a plurality of openings corresponding to a plurality of light-emitting elements and a plurality of transmissive members covering the respective openings. Japanese Patent Publication No. 2017-034242 describes a light-emitting device having a lid body provided with a plurality of openings corresponding to respective light-emitting elements and one transmissive body covering all the openings.

SUMMARY

However, when only one opening is provided like the device described in Japanese Patent Publication No. 2017-139444, the size of a transmissive member becomes greater as a greater number of light-emitting elements are mounted, whereby the proportion of a bonding area to the transmissive member becomes relatively small. Thus, there is a fear that bonding strength may be reduced, and that hermeticity may be reduced during operation. This is because, in light-emitting devices including a plurality of light-emitting elements like the devices described in Japanese Patent Publication Nos. 2017-139444, 2017-138566, and 2017-034242, a thermal stress occurs in each member due to heat or the like generated by light-emitting elements during operation, and portions having weaker bonding strength are likely to be more easily separated.

When an adhesive member is formed on the periphery of each opening and one or a plurality of transmissive members are bonded like the devices described in Japanese Patent Publication Nos. 2017-138566 and 2017-034242, it appears that a further improvement in bonding strength is allowed compared with a case in which only one opening is provided like the device described in Japanese Patent Publication No. 2017-139444. However, in order to form the bonding member between the adjacent openings, the distance between the openings is required to be a size allowing the formation of the bonding members.

In one embodiment of the present disclosure, a light-emitting device includes: a package body; a lid body connected to the package body and forming sealed space together with the package body; and a plurality of light-emitting elements disposed in the sealed space. The lid body includes a non-transmissive member including an outer frame and one or more inner frames connected to the outer frame, a transmissive member integrally covering a plurality of openings defined by the outer frame and the inner frames and causing light emitted from the plurality of light-emitting elements to be transmitted in the plurality of openings, and an adhesive member fixing the transmissive member to the non-transmissive member, and the adhesive member is provided on the outer frame and is not provided on the inner frames.

In another embodiment, a lid body for use in a light-emitting device includes: a non-transmissive member including an outer frame and one or more inner frames connected to the outer frame; a transmissive member integrally covering a plurality of openings defined by the outer frame and the inner frames; and an adhesive member fixing the transmissive member to the non-transmissive member. The adhesive member is provided on the outer frame and is not provided on the inner frames.

In certain embodiments described herein, it is possible to provide a light-emitting device in which hermeticity is barely reduced. That is, it is possible to provide a light emitting-device that is reliable, in which the disposition density of light-emitting elements can be improved, and a lid body for use in the light-emitting device.

DETAILED DESCRIPTION OF EMBODIMENTS

Figure 1A:
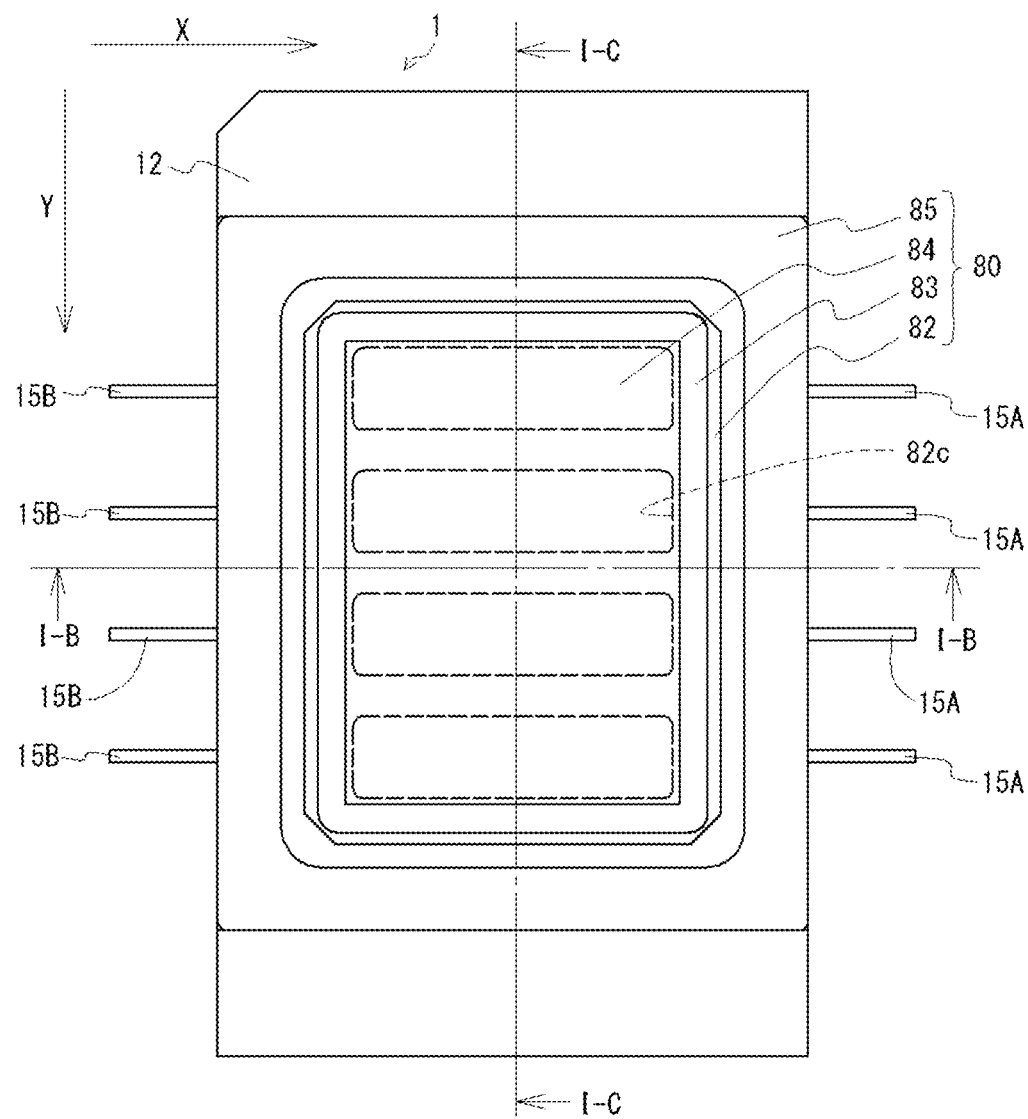
FIG. 1A is a schematic plan view of a light-emitting device according to an embodiment.
Figure 1B:
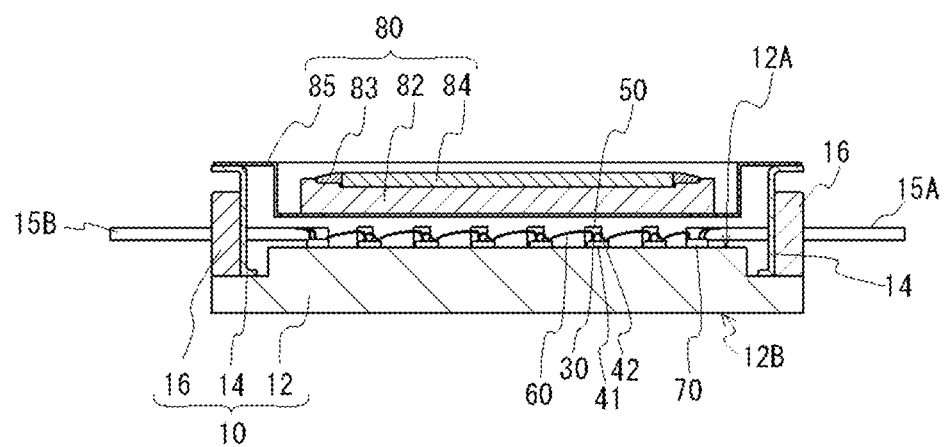
FIG. 1B is a schematic cross-sectional view taken along line I-B-I-B in FIG. 1A.
Figure 1C:
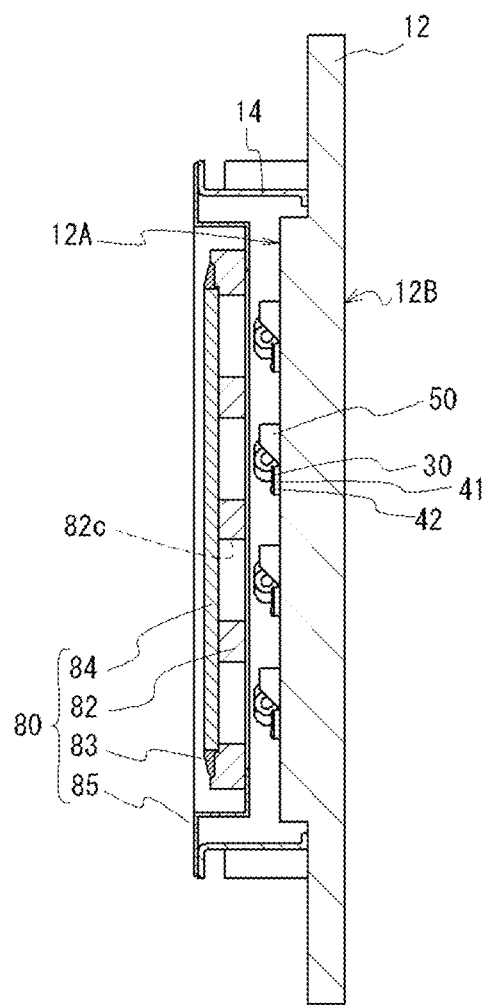
FIG. 1C is a schematic cross-sectional view taken along line I-C-I-C in FIG. 1A.
Figure 1D:
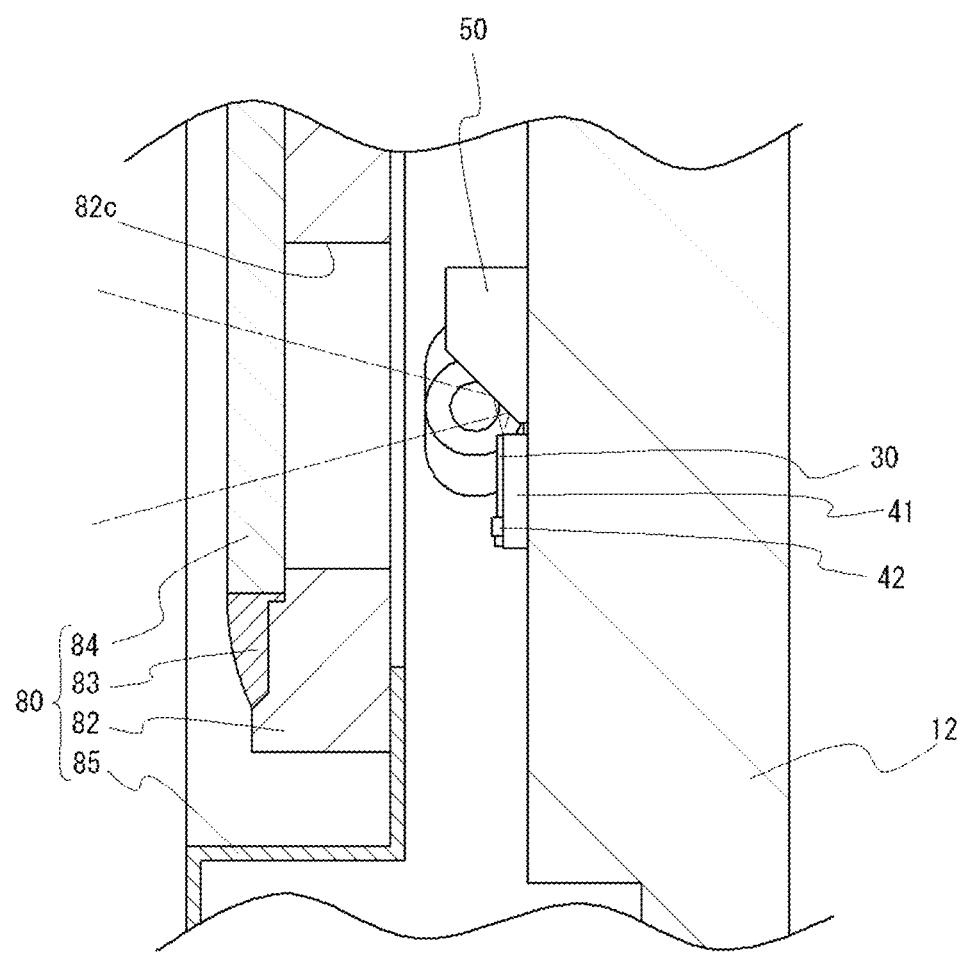
FIG. 1D is an enlarged view of a part of FIG. 1C.
Figure 2A:
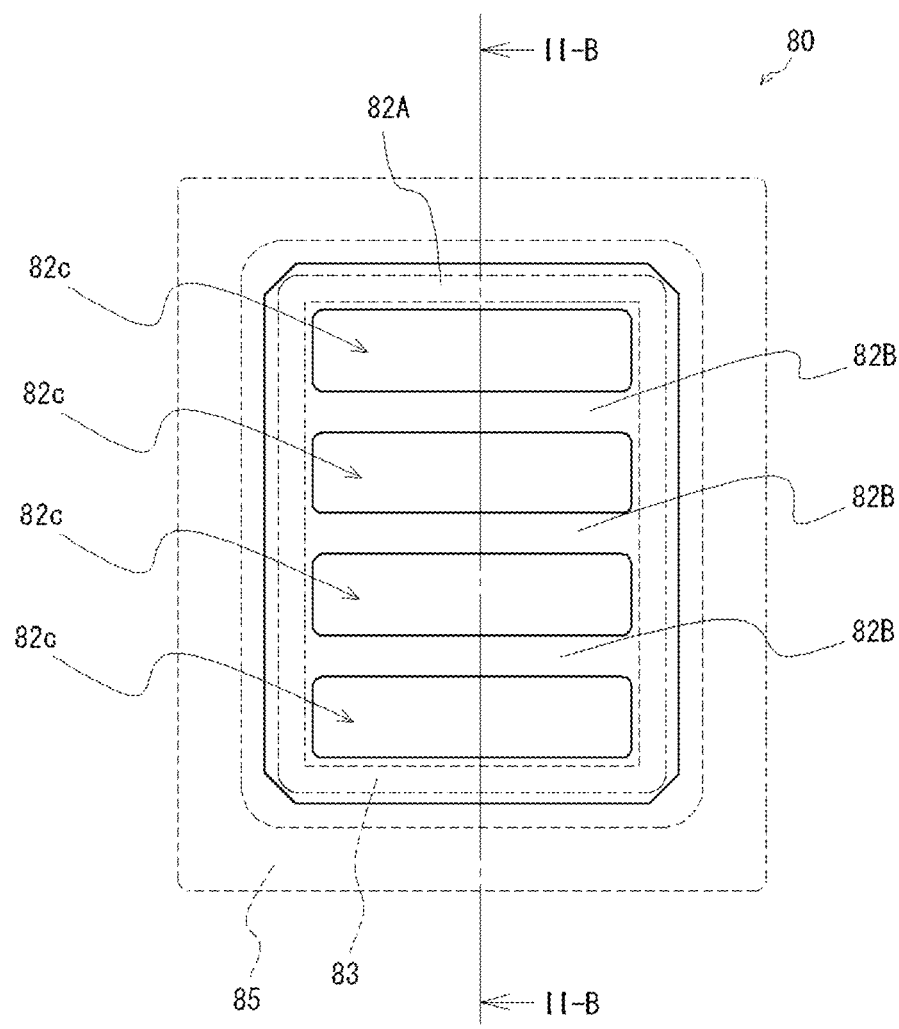
FIG. 2A is a schematic plan view of a lid body.
Figure 2B:
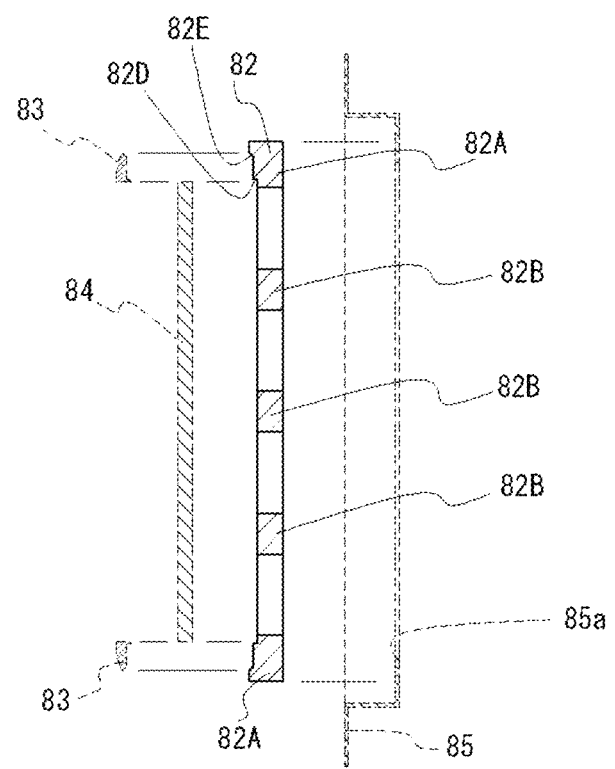
FIG. 2B is a schematic exploded cross-sectional view taken along line II-B-II-B in FIG. 2A.
Figure 3:
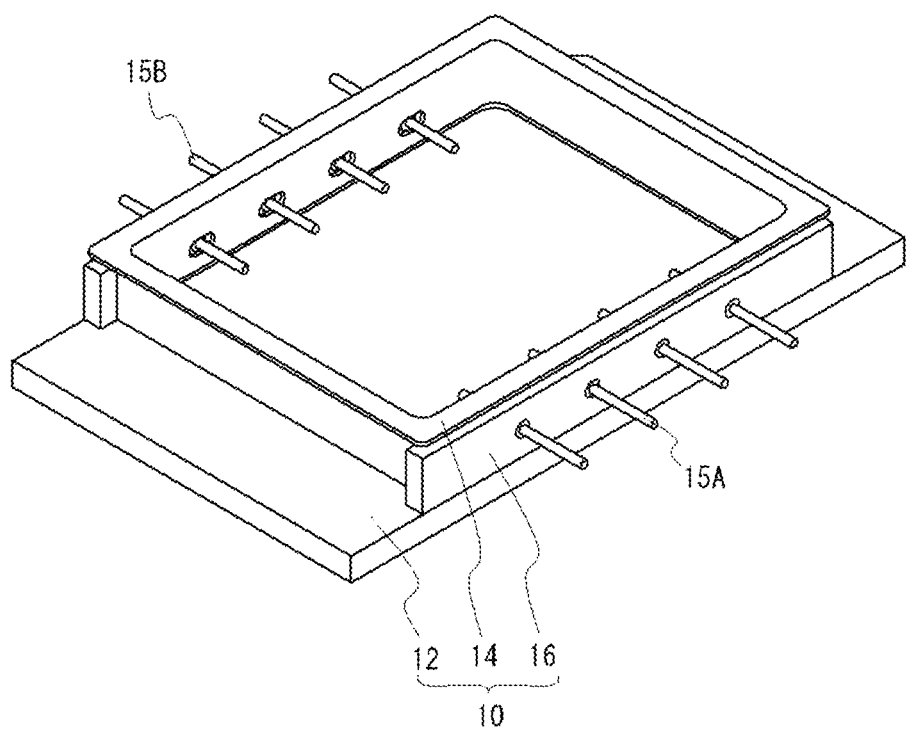
FIG. 3 is a schematic perspective view of a package body, anode terminals, and cathode terminals.
Figure 4:
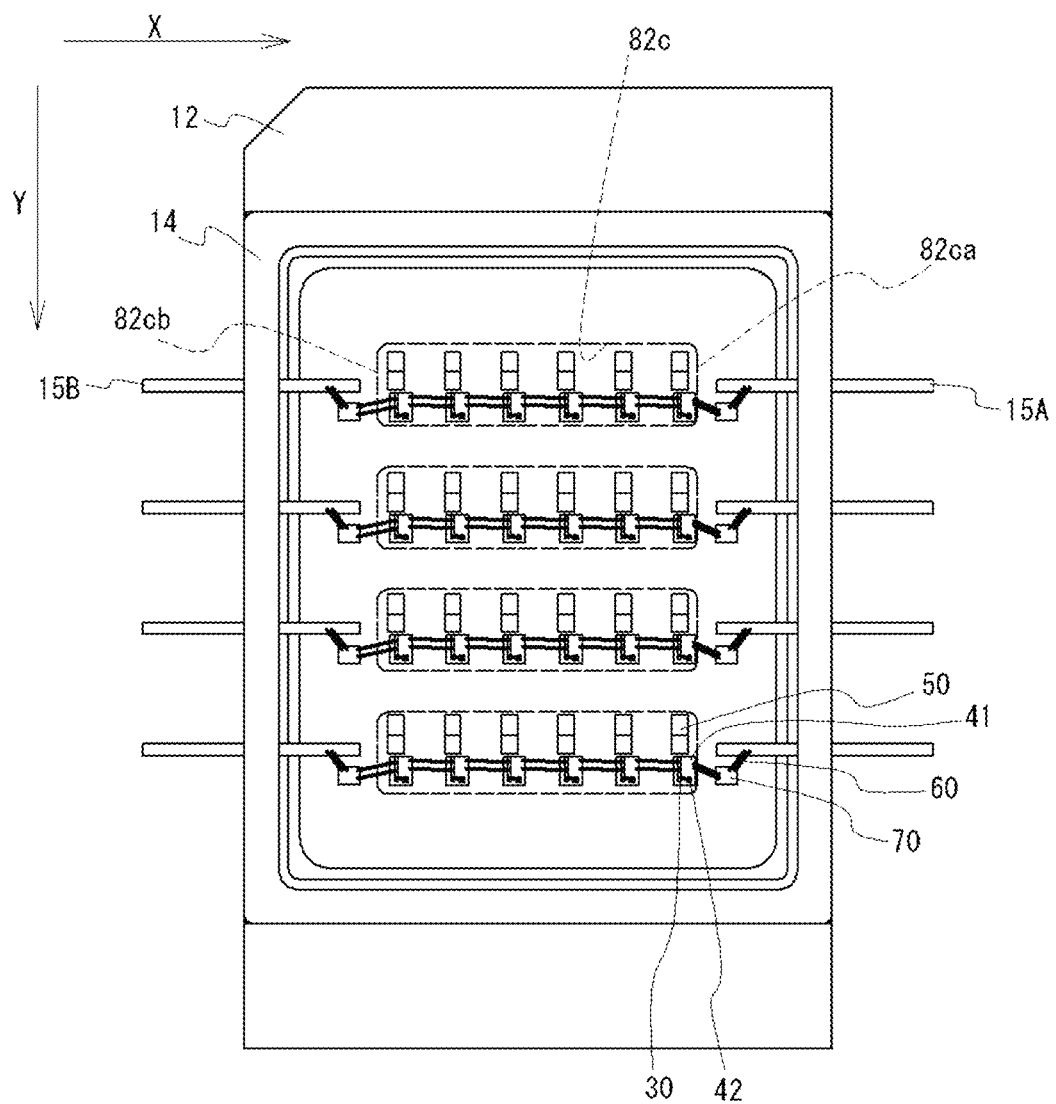
FIG. 4 is a schematic plan view showing a state in which light-emitting elements are disposed in the package body.

FIG. 1A is a schematic plan view of a light-emitting device 1 according to an embodiment. FIG. 1B is a cross-sectional view taken along line I-B-I-B in FIG. 1A, and FIG. 1C is a cross-sectional view taken along line I-C-I-C in FIG. 1A. FIG. 1D is an enlarged view of a part of FIG. 1C. FIG. 2A is a schematic plan view of a lid body 80, and FIG. 2B is a schematic exploded cross-sectional view taken along line II-B-II-B in FIG. 2A. FIG. 3 is a schematic perspective view of a package body 10, anode terminals 15A, and cathode terminals 15B. FIG. 4 is a schematic plan view showing a state in which light-emitting elements 30 are disposed in the package body 10. Note that the diagrammatic representation of wires 60 is omitted in FIGS. 1C and 1D. In addition, FIG. 1D schematically shows the path of light emitted from one of the light-emitting elements 30 with dashed lines.

As shown in FIGS. 1A to 4, the light-emitting device 1 has the package body 10, the lid body 80, and the plurality of light-emitting elements 30. The lid body 80 is connected to the package body 10 and forms sealed space with the package body 10. The plurality of light-emitting elements 30 is disposed in the sealed space. The lid body 80 has a non-transmissive member 82, a transmissive member 84, and an adhesive member 83. As shown in FIG. 2A, the non-transmissive member 82 includes an outer frame 82A and one or more inner frames 82B connected to the outer frame 82A. The transmissive member 84 integrally covers a plurality of openings 82c defined by the outer frame 82A and the inner frames 82B and causes light emitted from the plurality of light-emitting elements 30 to be transmitted in the plurality of openings 82c. The adhesive member 83 fixes the transmissive member 84 to the non-transmissive member 82. As shown in FIG. 2A, the adhesive member 83 is provided on the outer frame 82A and is not provided on the inner frames 82B.

With such configurations, a light-emitting device 1 can be achieved in which hermeticity is barely reduced. That is, a light-emitting device 1 can be achieved that is reliable, and in which the disposition density of the light-emitting elements 30 can be improved. That is, with the inner frames 82B, the non-transmissive member 82 may have improved resistance to twisting compared with a case in which the inner frames 82B are not provided. In addition, the inner frames 82B are not provided with the adhesive member 83 but are capable of supporting the transmissive member 84 so as not to be easily deformed. Thus, because the light-emitting device 1 is allowed to maintain its hermeticity compared with a case in which the inner frames 82B are not provided, the reliability of the light-emitting device 1 may be improved. In addition, because the one transmissive member 84 is provided and the adhesive member 83 is provided on the outer frame 82A, there is no fear that the transmissive member and the adhesive member interfere with the inner frames 82B, unlike a case in which the transmissive member and the adhesive member are provided for each of the plurality of openings 82c. Accordingly, the light-emitting device 1 may have hermeticity even with the inner frames 82B having a narrower width compared with a case in which the transmissive member or the like is provided for each of the plurality of openings 82c. By making the width of the inner frames 82B narrow as described above, it is possible to dispose the light-emitting elements 30 at higher density.

Hereinafter, each member included in the light-emitting device 1 will be described in turn.

Package Body 10

As shown in FIG. 3, the package body 10 used in the light-emitting device 1 may have a base body 12, a frame body 14, and plate bodies 16.

Base Body 12

The base body 12 is a member on which the light-emitting elements 30 or the like are mountable. Typically, a lower surface 12B of the base body 12 is thermally connected to a heat sink or the like and used as a radiation surface for radiating the heat of the light-emitting elements 30. The base body 12 may be a plate-shaped member or may be a member having a protrusion protruding upward as shown in FIG. 3. The protrusion is formed at a position surrounded by the frame body 14, and a region corresponding to the top surface of the protrusion of an upper surface 12A becomes a mounting surface on which the light-emitting elements 30 or the like are mounted. Because the bonding strength of a bonding member that fixes the light-emitting elements 30 or the like is improved as the mounting surface is flatter, it is preferable to perform flattening processing on the mounting surface before mounting the light-emitting elements 30 or the like. Examples of the flattening processing include grinding, rolling, or the like. Note in the specification, the upper surface 12A of the base body 12 represents a surface on a side on which the light-emitting elements 30 are mounted, and a lower surface 12B represents a surface on a side opposite to the side of the upper surface 12A. In addition, in the specification, an "upward direction" represents a direction from the lower surface 12B to the upper surface 12A of the base body 12, and a plan view is equivalent to a top view.

The base body 12 may be made of a ceramic material or a metal material, but is preferably made of a metal material for an improvement in its radiation performance. Examples of the metal material include iron, an iron alloy, copper, a copper alloy, or the like.

Frame Body 14

The frame body 14 is bonded to the upper surface 12A of the base body 12. The region surrounded by the frame body 14 is a region in which the light-emitting elements 30 or the like are mounted. The frame body 14 is bonded to the base body 12 so that the light-emitting elements 30 or the like may be hermetically sealed when the lid body 80 is bonded to the frame body 14. As shown in FIGS. 1B and 1C, the frame body 14 may be bonded to the peripheral surface of the protrusion of the base body 12.

As shown in FIG. 3, the anode terminals 15A and the cathode terminals 15B may be fixed to the plate bodies 16. In this case, because the anode terminals 15A and the cathode terminals 15B are not required to be fixed to the frame body 14, the thickness of the frame body 14 may be less than that of the plate bodies 16. The thickness of the frame body 14 is preferably in the range of 0.1 mm to 1.0 mm and more preferably in the range of 0.2 mm to 0.8 mm. Examples of the material of the frame body 14 include steel plate cold (SPC). Compared with KOVAR®, SPC may be more easily formed into the shape of the frame body 14 and manufactured at low cost.

The outer shape of the frame body 14 is, for example, a substantially rectangular shape in a top view. In this case, the frame body 14 has a first outer surface, a second outer surface, a third outer surface, and a fourth outer surface as shown in FIG. 3. The second outer surface is located on a side opposite to the side of the first outer surface, and the fourth outer surface is located on a side opposite to the side of the third outer surface. Note that the substantially rectangular shape includes, besides a rectangle, a shape in which one or more corners of a rectangle are chamfered. The outer shape of the frame body 14 in a top view may be a shape in which all the corners of a rectangle are chamfered. In the package body 10 shown in FIG. 3, the anode terminals 15A are inserted in through-holes provided on the first outer surface, and the cathode terminals 15B are inserted in through-holes provided on the second outer surface. For example, each one of the through-holes is individually provided for each one of the anode terminals 15A and the cathode terminals 15B. When the plate bodies 16 are not provided, each one of the anode terminals 15A and the cathode terminals 15B is fixed to each one of the through-holes of the frame body 14 via a fixation member.

Anode Terminals 15A and Cathode Terminals 15B

The anode terminals 15A and the cathode terminals 15B are members for electrically connecting the light-emitting elements 30 to an external power supply or the like. The anode terminals 15A and the cathode terminals 15B may be fixed to the plate bodies 16 via fixation members. Examples of the material of the fixation members include a borosilicate glass. Because the anode terminals 15A and the cathode terminals 15B are not provided on the lower surface 12B of the base body 12, substantially the whole surface of the lower surface 12B of the base body 12 may be used as a radiation surface. Thus, heat generated by the disposition of the plurality of light-emitting elements 30 serving as heat sources in the one package body 10 may be satisfactorily radiated. The anode terminals 15A and the cathode terminals 15B are made of, for example, metal. Examples of the material of the anode terminals 15A and the cathode terminals 15B include KOVAR®, an iron nickel alloy, or the like.

As shown in FIG. 4, each of the plurality of openings 82c may have a first end 82ca and a second end 82cb in a first direction X. In this case, each of the anode terminals 15A may penetrate the package body 10 in the first direction X on the side of the first end 82ca, and each of the cathode terminals 15B may penetrate the package body 10 in the first direction X on the side of the second end 82cb. That is, each of the anode terminals 15A and the cathode terminals 15B may be arranged to penetrate a different lateral surface of the frame body 14. As shown in FIG. 4, each one of the cathode terminals 15B may be arranged along an extending direction of each one of the anode terminals 15A. In this case, the extending direction of one of the anode terminals 15A is the first direction X. The arrangement of the anode terminals 15A and the cathode terminals 15B like this is suitable for a mode in which the two or more light-emitting elements 30 are disposed side by side in the first direction X and connected in series to each other.

It is preferable to pair each one of the anode terminals 15A with each one of the cathode terminals 15B and to provide a plurality of pairs of the anode terminal 15A and the cathode terminal 15B. Thus, as shown in FIG. 4, a plurality of pairs in which the plurality of light-emitting elements 30 is connected in series to each other may be provided. In addition, as shown in FIG. 4, it is preferable to provide at least pairs of the anode terminal 15A and the cathode terminal 15B the number of which is the same as the number of the plurality of openings 82c. In this case, all the light-emitting elements 30 that use each one of the openings 82c as the path of light among the plurality of light-emitting elements 30 are electrically connected to a pair of the anode terminal 15A and the cathode terminal 15B. Thus, because one or more pairs of the anode terminal 15A and the cathode terminal 15B are allowed to correspond to each one of the openings 82c, the number of the light-emitting elements 30 mounted to each one of the openings 82c may be selected. The two or more light-emitting elements 30 disposed between a pair of the anode terminal 15A and the cathode terminal 15B are connected in series to each other and electrically connected to the anode terminal 15A and the cathode terminal 15B.

Moreover, when the light-emitting elements 30 are disposed in a matrix like shape as shown in FIG. 4, the arrangement of a pair of the anode terminal 15A and the cathode terminal 15B may be based on the column of the light-emitting elements 30, instead of being based on each one of the openings 82c. That is, pairs of the anode terminal 15A and the cathode terminals 15B, the number of which is the same as or greater than the number of the columns of the light-emitting elements 30, may be provided. Note that a plurality of the columns of light-emitting elements 30 may be disposed in each one of the openings 82c. However, because the areas of the inner frames 82B that support the transmissive member 84 are relatively reduced as the size of the opening 82c becomes greater, it is preferable to dispose only one column of the light-emitting elements 30 in one each of the openings 82c as shown in FIG. 4.

Plate Bodies 16

The plate bodies 16 may be bonded to the outer surface of the frame body 14. The plate bodies 16 are provided with the through-holes, and each of the anode terminals 15A and the cathode terminals 15B is inserted in each of the through-holes. In the package body 10 shown in FIGS. 1A to 1C, the plate bodies 16 are bonded to the two outer surfaces of the frame body 14 that face each another, with each of the plate bodies being provided with a plurality of the through-holes, and each of the anode terminals 15A and the cathode terminals 15B is arranged in each of the through-holes.

The thickness of the plate bodies 16 is preferably greater than that of the frame body 14. Specific examples of the thickness of the plate bodies 16 include the range of about 1.0 mm to 3.0 mm. Examples of the material of the plate bodies 16 include metal such as KOVAR®. The shape of the plate bodies 16 is, for example, a substantially cuboid shape. That is, the shape of the plate bodies 16 may include, besides a cuboid, a shape in which one or more corners of a cuboid are chamfered. The plate bodies 16 and the frame body 14 are bonded together using a bonding material such as, for example, silver solder.

Light-Emitting Elements 30

FIG. 4 is a schematic plan view showing a state in which the light-emitting elements 30 are disposed on the base body 12. As shown in FIG. 4, the light-emitting elements 30 are placed on the side of the upper surface 12A of the base body 12. Note that the placement of the light-emitting elements 30 on the side of the upper surface 12A is not limited to a case in which the light-emitting elements 30 are directly bonded to the upper surface 12A but includes a case in which the light-emitting elements 30 are fixed to the upper surface 12A via other members. In the light-emitting device 1, sub-mounts 41 are fixed to the upper surface 12A, and the light-emitting elements 30 are fixed to the sub-mounts 41 as shown in FIG. 1D. When the light-emitting elements 30 are disposed via the sub-mounts 41, a material having a thermal expansion coefficient between the thermal expansion coefficient of the base body 12 and the thermal expansion coefficient of the light-emitting elements 30 may be used as the material of the sub-mounts 41. Thus, a stress occurring due to a change in temperature may be reduced.

The light-emitting device 1 has the plurality of light-emitting elements 30. As the light-emitting device 1 has a greater number of the light-emitting elements 30, a calorific heat during operation becomes greater and a stress occurring due to a change in temperature becomes greater. However, with the above structures, even the light-emitting device 1 having a great calorific heat may reduce the possibility of reducing its hermeticity. The number of the light-emitting elements 30 is, for example, four or more, and may be in the range of four to 40.

The plurality of light-emitting elements 30 may be disposed in a matrix like shape in the first direction (X-direction in FIG. 4) and a second direction (Y-direction in FIG. 4). As shown in FIGS. 1A to 1C, all the light-emitting elements 30 that use each one of the openings 82c as the path of light among the plurality of light-emitting elements 30 may be disposed linearly along the first direction X.

The light-emitting elements 30 are preferably semiconductor laser elements. Examples of the semiconductor laser elements include those having an active layer made of a nitride semiconductor. Because dust is likely to be collected depending on emitted laser light when such semiconductor laser elements are used, it is preferable to hermetically seal the semiconductor laser elements. The light-emitting device 1 is allowed to prevent dust collection because it is capable of preventing reduction in hermiticity. Examples of the nitride semiconductor include a group III-V semiconductor such as $Al_xIn_yGa_{1-x-y}N$ (where $0 \le x \le 1$, $0 \le y \le 1$, and $0 \le x+$ y≤1). The semiconductor laser elements have, for example, a semiconductor stacked body in which an n-type semiconductor layer, an active layer, and a p-type semiconductor layer are stacked in this order, an n-electrode electrically connected to the n-type semiconductor layer, and a p-electrode electrically connected to the p-type semiconductor layer. Each of the plurality of semiconductor laser elements emits laser light. Each laser light is extracted to an outside from the lid body 80 directly or via a mirror 50 or the like. A fluorescent material containing member may be arranged on the light path of laser light to extract fluorescence excited by the laser light to the outside. As the light-emitting elements 30, high-output semiconductor laser elements of 1 W or greater are, for example, used.

The plurality of light-emitting elements 30 may be electrically connected to each other by the wires 60 or the like. As the wires 60, gold, copper, aluminum, or the like may be used. For example, as shown in FIG. 4, the plurality of light-emitting elements 30 disposed in the first direction X is connected in series to each other by the wires 60.

As shown in FIGS. 1B and 4, relay members 70 may be provided between the anode terminals 15A and the light-emitting elements 30 and/or between the cathode terminals 15B and the light-emitting elements 30. The wires 60 from the light-emitting elements 30 or the sub-mounts 41 may be connected to the relay members 70, and the wires 60 from the relay members 70 may be connected to the anode terminals 15A or the cathode terminals 15B. Note that the light-emitting elements 30 are not disposed on the relay members 70.

Mirrors 50

As shown in FIG. 1D, the light-emitting device 1 may include the mirrors 50. In this case, the light-emitting elements 30 are semiconductor laser elements. The mirrors 50 are arranged so that the light emitting surfaces of the semiconductor laser elements for emitting laser light and the inclined surfaces of the mirrors 50 face each other. The mirrors 50 have a reflection surface that reflects laser light emitted from the semiconductor layer elements. The mirrors 50 have, for example, a base body including a mounting surface and an inclined surface inclined with respect to the mounting surface and a reflection film provided on the inclined surface of the base body. As the base body of the mirrors 50, glass, synthetic quart, silicon, sapphire, aluminum, or the like may be used. As the reflection film of the mirrors 50, a metal film, a dielectric multilayer film, or the like may be used.

Lid Body 80

As described above, the lid body 80 has the non-transmissive member 82, the transmissive member 84, and the adhesive member 83. The lid body 80 is connected to the package body 10. Thus, it is possible to form the sealed space and hermetically seal the light-emitting elements 30. As shown in FIGS. 2A and 2B, the lid body 80 may further have a support member 85. The openings 82*c* are provided at positions at which the extraction of light emitted from the plurality of light-emitting elements 30 (for example, the laser light of the semiconductor laser elements) to the outside is allowed.

Non-Transmissive Member 82

As shown in FIG. 2A, the non-transmissive member 82 includes the outer frame 82A and the one or more inner frames 82B connected to the outer frame 82A. In addition, the non-transmissive member 82 is provided with the plurality of openings 82*c* defined by the outer frame 82A and the inner frames 82B. Note that in FIGS. 2A and 2B, the non-transmissive member 82 is shown by a solid line, and members other than the non-transmissive member 82 are shown by broken lines.

Each of the plurality of openings 82*c* is preferably in the path of light emitted from two or more of the plurality of light-emitting elements 30. In other words, each of the plurality of openings 82*c* preferably has a size by which each of the plurality of openings 82*c* is in the path of light emitted from two or more of the plurality of light-emitting elements 30. Thus, because the number and the disposition of the light-emitting elements 30 may be freely selected so long as each of the plurality of openings 82*c* is in the path of light emitted from two or more of the plurality of light-emitting elements 30, it is possible to manufacture a plurality of types of the light-emitting devices 1 different in the number and the disposition of the mounted light-emitting elements 30 while using the lid body 80 of the same design. Because the common members may be used among the plurality of types of light-emitting devices 1 as described above, it is possible to reduce the costs of the light-emitting devices 1. In addition, the inner frames 82B preferably extend only in one direction to improve a high degree of flexibility in the disposition of the light-emitting elements 30. That is, each of the first ends 82*ca* and the second ends 82*cb* of the openings 82*c* is preferably the outer edge of the outer frame 82A. For example, in a case in which inner frames extending in the first direction X and inner frames extending in the second direction Y coexist, it is required to avoid both the inner frames to dispose the light-emitting elements 30. However, because the non-transmissive member 82 has only the inner frames 82B extending in one direction such as the first direction X, the light-emitting elements 30 may be freely disposed in the one direction.

As shown in FIGS. 1B and 1C, the non-transmissive member 82 is preferably arranged beneath the transmissive member 84, i.e., on the side of the light-emitting elements 30. The hermeticity of the light-emitting device 1 is examined under, for example, pressurization. When the non-transmissive member 82 is arranged beneath the transmissive member 84, the deformation degree of the transmissive member 84 may be reduced by the non-transmissive member 82, particularly by the inner frames 82B. Thus, the possibility of impairing the hermeticity due to the damage of the transmissive member 84 or the like may be reduced. In addition, in this case, the upper surfaces of the inner frames 82B of the non-transmissive member 82 preferably contact the lower surface of the transmissive member 84. Thus, the deformation degree of the transmissive member 84 may be more reliably reduced.

As shown in FIG. 2B, the non-transmissive member 82 may have a first inner surface 82D arranged on an outer side than the openings 82*c* to position the transmissive member 84. In a plan view, the shape of the first inner surface 82D is preferably substantially the same as that of the outer edge of the transmissive member 84. However, the first inner surface 82D is made slightly greater in size than the transmissive member 84 so that the transmissive member 84 is positioned inside the first inner surface 82D. In addition, the non-transmissive member 82 may have a second inner surface 82E arranged on an outer side than the first inner surface 82D. By the provision of the second inner surface 82E, the adhesive member 83 may be fixed at and/or inward of the second inner surface 82E. Only one of the first inner surface 82D and the second inner surface 82E may be provided.

The inner frames 82B preferably extend from one part of the outer frame 82A along the first direction X and reach another part of the outer frame 82A, and the spot shape of light emitted from the plurality of light-emitting elements 30 and irradiated onto the transmissive member 84 is preferably an ellipse having its minor axis oriented in the first direction X. Thus, it is possible to dispose the light-emitting elements 30 in each one of the opening 82c at high density. Such a disposition is particularly preferable when the light-emitting elements 30 are semiconductor laser elements. The light extracted from the transmissive member 84 is caused to be incident on, for example, a lens member having a lens. In this case, because one lens preferably corresponds to one laser light beam, the distance between the semiconductor laser elements may be further reduced in the first direction X representing the short-axis direction of the spot shape than in the second direction Y representing the long-axis direction of the spot shape. Accordingly, the semiconductor laser elements may be disposed at higher density in the first direction X.

As shown in FIG. 2A, the width of the inner frames 82B (i.e., the distance between one outer edge and the other outer edge of the inner frames 82B in the second direction Y) may be substantially constant.

In FIG. 4, the positions of the openings 82c of the non-transmissive member 82 are shown by broken lines. As shown in FIG. 4, the openings 82c may have, in a plan view, a shape elongated in the direction (first direction X) in which a pair of the anode terminal 15A and the cathode terminal 15B are disposed. Such a shape is preferable to prevent an increase in the width of the openings 82c in the second direction Y and increase the upper limit of the number of the light-emitting elements 30 capable of being disposed between a pair of the anode terminal 15A and the cathode terminal 15B. The shape of the openings 82c in a plan view is, for example, a substantially rectangular shape having long sides and short sides. The substantially rectangular shape includes, besides a rectangle, a shape in which the corners of a rectangle are rounded and a shape in which the corners of a rectangle are chamfered.

As the non-transmissive member 82, glass, metal, ceramic, a material in which these materials are combined together, or the like may be used. Preferably, metal is used. Because the frame body 14 and the lid body 80 may be fixed to each other by welding or the like when metal is used as the non-transmissive member 82, the light-emitting elements 30 are easily hermetically sealed.

Adhesive Member 83

As shown in FIG. 1D, the adhesive member 83 is preferably connected to the lateral surface of the surface of the transmissive member 84. Thus, because the upper surfaces of the inner frames 82B not provided with the adhesive member 83 are caused to easily contact the lower surface of the transmissive member 84, it is possible to support the transmissive member 84 with the inner frames 82B. In addition, when the adhesive member 83 is arranged between the non-transmissive member 82 and the transmissive member 84, there is a fear that the adhesive member 83 spreads on the surface of the transmissive member 84 during adhesion, and that the path of light emitted from the light-emitting elements 30 is covered by the adhesive member 83. By the connection of the adhesive member 83 to the lateral surface of the transmissive member 84, the region of the transmissive member 84 that allows light to be transmitted may be increased. In order to more reliably obtain these effects, the adhesive member 83 is preferably substantially connected only to the lateral surface of the surface of the transmissive member 84. The adhesive member 83 may be formed by being first formed at a position not contacting the transmissive member 84 and then melted and connected to the transmissive member 84.

Examples of the material of the adhesive member 83 include a glass material and a metal material. When a metal material such as solder is used as the adhesive member 83, it is preferable to form a metalized layer on the transmissive member 84 in advance to improve adhesion to the transmissive member 84. However, because it is difficult to form a uniform metalized layer on the lateral surface of the transmissive member 84, the adhesive member 83 is preferably made of a glass material. As a glass material, a material that softens, deforms, and flows at 600° C. or less may be used.

Transmissive Member 84

As the transmissive member 84, a member that causes at least some of light emitted in the sealed space surrounded by the package body 10 and the lid body 80 to be transmitted is used. For example, a member that causes light emitted from the light-emitting elements 30 to be transmitted is used. In addition, when a fluorescent material containing member excited by light emitted from the light-emitting elements 30 is arranged in the sealed space, at least a member that causes the fluorescence to be transmitted is used as the transmissive member 84.

Support Member 85

As shown in FIGS. 2A and 2B, the lid body 80 may have the support member 85. In this case, the support member 85 is connected to the package body 10 by welding or the like. The support member 85 is a member that supports the non-transmissive member 82. The support member 85 is provided with an opening 85a. In a plan view, the outer edge of the opening 85a is positioned on an inner side than the outer edge of the non-transmissive member 82 and positioned on an outer side than the openings 82c of the non-transmissive member 82. Further, a bonding member is arranged between the outer edge of the opening 85a and the outer edge of the non-transmissive member 82, and the upper surface of the support member 85 and the lower surface of the non-transmissive member 82 are bonded together by the bonding member. As the material of the bonding member, a solder material may be used. For example, silver solder or the like may be used. The thickness of the bonding member is preferably 3 μm or more and more preferably 10 or more from the viewpoint of reducing a stress. On the other hand, the thickness of the bonding member may be preferably 200 μm or less and more preferably 100 μm or less from the viewpoint of ensuring the strength of the bonding part.

The support member 85 may be made of a material same as or different from the material of the non-transmissive member 82. When the support member 85 is made of a different material, the thermal expansion coefficient of the non-transmissive member 82 is preferably made closer to the thermal expansion coefficient of the transmissive member 84 than the thermal expansion coefficient of the support member 85. Thus, the occurrence of a stress due to a difference in the thermal expansion coefficient and the cracks of the transmissive member 84 may be prevented. Note that the support member 85 and the non-transmissive member 82 are separate members in the embodiment but may be an integrated member.

Other Members

In the light-emitting device 1, a lens member having a lens may be arranged on the lid body 80. In addition, the light-emitting device 1 may include protection elements 42 such as Zener diodes. For example, each one of the protection elements 42 may be connected to each one of the light-emitting elements 30. In this case, each one of the protection elements 42 and each one of the light-emitting elements 30 may be fixed to each one of the sub-mounts 41.

While embodiments are described above, the present invention is not limited to the described embodiments.

What is claimed is:

1. A light-emitting device comprising:
a package body;
a lid body connected to the package body, wherein the package body and the lid body together form a sealed space; and
a plurality of light-emitting elements disposed in the sealed space,
wherein the lid body comprises:
a non-transmissive member including an outer frame, and one or more inner frames connected to the outer frame, wherein the outer frame and the one or more inner frames define a plurality of openings,
a transmissive member integrally covering the plurality of openings and configured to allow light emitted from the plurality of light-emitting elements to be transmitted through the plurality of openings, and
an adhesive member fixing the transmissive member to the non-transmissive member; and
wherein the adhesive member is located on the outer frame and is not located on the one or more inner frames.

2. The light-emitting device according to claim 1, wherein:
each of the plurality of openings is a path of light emitted from two or more of the plurality of light-emitting elements.

3. The light-emitting device according to claim 1, wherein:
the adhesive member is connected to a lateral surface of the transmissive member.

4. The light-emitting device according to claim 1, wherein:
the adhesive member is made of a glass material.

5. The light-emitting device according to claim 1, wherein:
each of the plurality of light-emitting elements is a semiconductor laser element.

6. The light-emitting device according to claim 5, wherein:
the one or more inner frames extend from a first part of the outer frame to a second part of the outer frame along a first direction; and
a spot shape of light emitted from the plurality of light-emitting elements and irradiated onto the transmissive member is an ellipse having a minor axis oriented in the first direction.

7. The light-emitting device according to claim 6, wherein:
each of the plurality of openings has a first end and a second end in the first direction; and
the light-emitting device has an anode terminal penetrating the package body in the first direction on a side of the first end and a cathode terminal penetrating the package body in the first direction on a side of the second end.

8. The light-emitting device according to claim 7, wherein:
a number of pairs of the anode terminal and the cathode terminal is at least as high as a number of the plurality of openings; and
among the plurality of light-emitting elements, all light-emitting elements corresponding to one of the openings are electrically connected to one of the pairs of the anode terminal and the cathode terminal.

9. The light-emitting device according to claim 1, wherein:
the lid body comprises a support member supporting the non-transmissive member.

10. The light-emitting device according to claim 9, wherein:
the support member comprises an opening; and
in a plan view, an outer edge of the opening of the support member is positioned inward of an outer edge of the non-transmissive member and outward of the openings of the non-transmissive member.

11. The light-emitting device according to claim 10, wherein:
the lid body comprises a bonding member located between the outer edge of the opening of the support member and the outer edge of the non-transmissive member; and
an upper surface of the support member and a lower surface of the non-transmissive member are bonded together by the bonding member.

12. A lid body for use in a light-emitting device, the lid body comprising:
a non-transmissive member comprising an outer frame and one or more inner frames connected to the outer frame, wherein the outer frame and the one or more inner frames define a plurality of openings;
a transmissive member integrally covering the plurality of openings; and
an adhesive member fixing the transmissive member to the non-transmissive member,
wherein the adhesive member is located on the outer frame and is not located on the inner frames.

13. The lid body according to claim 12, wherein:
the adhesive member is connected to a lateral surface of the transmissive member.

14. The lid body according to claim 12, wherein:
the adhesive member is made of a glass material.

15. The lid body according to claim 12, wherein:
the one or more inner frames extend from a first part of the outer frame to a second part of the outer frame along a first direction.

16. The lid body according to claim 12, further comprising:
a support member supporting the non-transmissive member.

17. The lid body according to claim 16, wherein:
the support member comprises an opening; and
in a plan view, an outer edge of the opening of the support member is positioned inward of an outer edge of the non-transmissive member and outward of the openings of the non-transmissive member.

18. The lid body according to claim 17, wherein:
the lid body comprises a bonding member located between the outer edge of the opening of the support member and the outer edge of the non-transmissive member; and
an upper surface of the support member and a lower surface of the non-transmissive member are bonded together by the bonding member.

* * * * *